United States Patent [19]

Goodman

[11] 4,374,455

[45] Feb. 22, 1983

[54] METHOD FOR MANUFACTURING A VERTICAL, GROOVED MOSFET

[75] Inventor: Lawrence A. Goodman, Plainsboro, N.J.

[73] Assignee: RCA Corporation, New York, N.Y.

[21] Appl. No.: 351,250

[22] Filed: Feb. 22, 1982

Related U.S. Application Data

[62] Division of Ser. No. 89,315, Oct. 30, 1979, abandoned.

[51] Int. Cl.³ .................................................. H01L 21/22
[52] U.S. Cl. ........................................ 29/571; 29/580; 29/578; 148/187
[58] Field of Search ..................... 29/571, 580, 578; 148/187

[56] References Cited

U.S. PATENT DOCUMENTS

| | | | |
|---|---|---|---|
| 4,055,884 | 11/1977 | Jambotkar | 29/571 |
| 4,065,783 | 12/1977 | Ouyang | 148/187 X |
| 4,084,175 | 4/1978 | Ouyang | 357/55 |
| 4,105,475 | 8/1978 | Jenne | 29/571 X |
| 4,116,720 | 9/1978 | Vinson | 148/1.5 |
| 4,131,907 | 12/1978 | Ouyang | 357/42 |
| 4,145,703 | 3/1979 | Blanchard et al. | 357/55 |
| 4,200,968 | 5/1980 | Schroeder | 29/571 |
| 4,206,005 | 6/1980 | Yeh et al. | 148/187 X |
| 4,244,752 | 1/1981 | Henderson et al. | 148/187 X |
| 4,272,302 | 6/1981 | Jhabvala | 29/571 X |

OTHER PUBLICATIONS

Grooves Add New Dimension To V-Mos Structure and Performance, F. B. Jenne, Electronics, Aug. 18, 1977, pp. 100-106.

*Primary Examiner*—G. Ozaki
*Attorney, Agent, or Firm*—Birgit E. Morris; Donald S. Cohen; Kenneth R. Glick

[57] ABSTRACT

A MOSFET device having minimized parasitic bipolar effects comprises a substrate having a surface at which source and drain regions are spaced so as to define a channel portion in a body region. The channel portion is formed in a relatively low conductivity portion of the body region, the remainder of the body region being of higher conductivity. A gate overlies the channel portion, and a method for automatically aligning the gate to a grooved MOSFET is described.

11 Claims, 26 Drawing Figures

METHOD FOR MANUFACTURING A VERTICAL, GROOVED MOSFET

This is a division of application Ser. No. 089,315, filed Oct. 30, 1979, now abandoned.

BACKGROUND OF THE INVENTION

The present invention relates generally to metal oxide semiconductor field effect transistors (MOSFETS) and more particularly to vertical, grooved MOSFET (VMOS) devices, and vertical, double diffused MOSFET (VDMOS) devices.

A typical MOSFET structure comprises a semiconductor substrate which includes adjacent source, body and drain regions of alternate (i.e., P or N) conductivity type. In a vertical MOSFET the source and drain regions are on opposite semiconductor major surfaces and yield a vertical current flow (perpendicular to the surfaces) through the device. In a VDMOS device the semiconductor substrate is substantially planar in configuration. The body region is adjacent to one of the planar surfaces and the gate, comprising an electrode disposed over an oxide, is disposed on the surface over the body region. In a VMOS structure a groove in one of the semiconductor surfaces intersects the body region, and the gate is disposed within the groove over the body region.

When a VDMOS or VMOS device is appropriately biased, majority charge carriers flow from the source, through a channel (in a surface portion of the body region under the gate), to the drain. The device is thus unipolar in nature. However, the existence of PN junctions between the source and body and between the body and drain create the possibility for minority charge carrier flow (i.e., a parasitic bipolar transistor) as well. Since the efficiency of the unipolar MOSFET is degraded by this bipolar transistor it is desirable to minimize the minority carrier flow. The present invention provides a vertical MOSFET structure having minimized parasitic bipolar effects and a method for fabricating a VMOS structure.

SUMMARY OF THE INVENTION

A MOSFET device comprises a semiconductor substrate including, in series, adjacent source, body and drain regions of alternate conductivity type. The substrate includes a surface at which the source and drain regions are spaced so as to define a channel portion in the body region. The channel portion of the body is of relatively low conductivity compared to the remainder of the body, which has a substantial portion of higher conductivity. A gate is disposed on the channel portion; a source electrode contacts the source region and remainder portion of the body region; and a drain electrode contacts the drain region.

Additionally, a novel method for automatically aligning the groove (gate portion) of a VMOS device to the relatively low conductivity body portion, is disclosed.

DETAILED DESCRIPTION

Figure 1:
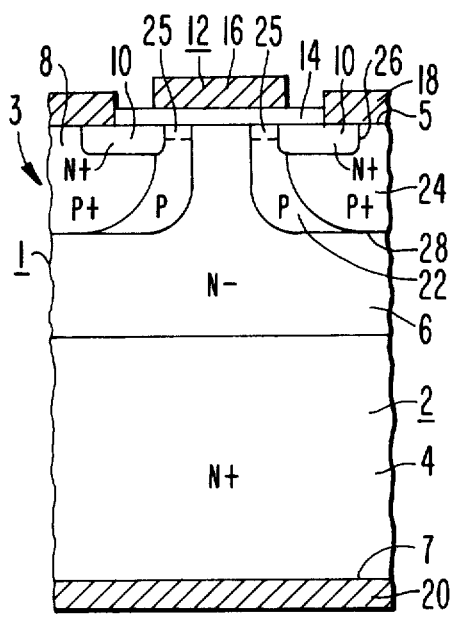
FIG. 1 is a sectional view of a VDMOS device embodying the present invention.

Referring to FIG. 1, a VDMOS device 3 of the present invention is shown. The device 3 comprises a substantially planar semiconductor substrate 1 having first and second opposing major surfaces (5 and 7, respectively). For clarity in the drawings, semiconductor regions have been identified as being of N or P type, however, it should be recognized that the device 3 would also be functional if each of these conductivity types was reversed. A drain region 2 is adjacent to the second surface 7 and extends to the first surface 5. In the preferred embodiment the drain region 2 comprises a substantially planar portion of relatively high conductivity 4 at the second surface 7, and an extended drain portion 6 of relatively low conductivity which is disposed across the high conductivity portion and extends to the first surface 5. A pair of body regions 8, spaced apart by the extended drain 6, extends into the substrate from the first surface 5 such that each body forms a PN junction 28 with the drain 2. Each body 8 further comprises a relatively low conductivity region 22 adjacent to the extended drain 6 at the first surface, and a higher conductivity region 24 occupying its remainder. A corresponding pair of source regions 10 extend into the substrate from the first surface within the boundaries of the body regions 8, each forming a PN junction 26 with a body region. The source regions 10 are located with respect to the extended drain region 6 between the pair of body regions 8 so as to define the respective lengths of a pair of channel portions 25 at the first surface of each relatively low conductivity body region 22.

In the VDMOS device 3 a gate 12 is disposed on the first surface 5 over both the pair of channel portions 25 and the extended drain region 6 between the channel portions 25. In the preferred embodiment the gate 12 comprises an oxide 14 on the substrate surface 5 and an electrode 16 over the oxide. A pair of source electrodes 18 contacts the first surface 5. Each source electrode 18 corresponds to a source region 10 and electrically shorts a source/body junction 26 at the first surface 5. A drain electrode 20 disposed on the second semiconductor surface 7 contacts the drain region 2. When a voltage exceeding a threshold voltage ($V_T$) is applied to the gate electrode 16, it induces a conduction path in each of the relatively low conductivity body regions 22 and creates a source to drain current from both source regions 10. The depth of each conduction path defines the depth of each channel portion 25 within each low conductivity body region 22.

Generally, the threshold voltage for a MOSFET device is dependent upon the charge carrier concentration in the channel portion(s) of its body region(s) ($V_T \propto$ [body concentration]$^{\frac{1}{2}}$). Since device sensitivity is increased by minimizing the threshold voltage, it is desirable to reduce the conductivity of the body region(s). However, a problem occurs in that if the conductivity of an entire body region is minimized, the resulting enhancement in sensitivity is offset by a commensurate increase in parasitic bipolar effects.

The body region of a MOSFET device corresponds to the base of a parasitic bipolar transistor. The parasitic effects arise by virtue of minority carrier flow across the source/body and body/drain PN junctions and can occur whenever a source/body junction is forward biased in the 0.6–0.8 volt range. The presence of bipolar parasitics reduces the breakdown voltage of the device by causing premature avalanching at the body/drain junction. To minimize bipolar effects, the conductivity (i.e., majority carrier concentration) in the body region should be relatively high. This will effectively reduce the gain (which is inversely proportional to the carrier concentration in the base) of the bipolar transistor. A conflict therefore exists in that increasing the conductivity of the body to reduce parasitics reduces the sensitivity of the device as well.

To reduce the bipolar parasitics without degrading the device sensitivity, the present invention utilizes body regions 8 each having both a relatively low conductivity region 22 and a higher conductivity region 24. By locating the gate 12 over the relatively low conductivity body regions 22 the objective is to have the channel portions 25 formed entirely within these low conductivity regions to thereby minimize the threshold voltage of the device. By providing the higher conductivity region 24 in the remainder of each body, the bipolar parasitics are reduced as well. In addition to reducing the gain of the parasitic bipolar transistor, the existence of higher conductivity body region 24 means that charge carriers moving through each body (from drain 2 to source 10) will produce a lower voltage drop, and thus be less likely to forward bias the source/body junction 26.

Furthermore, in the present invention each source electrode 18 is formed so as to contact both a source region 10 and a higher conductivity body region 24. By shorting these two regions, the likelihood of the source/body junctions 26 becoming forward biased is greatly reduced, and the bipolar parasitics are therefore further minimized.

The fabrication of a VDMOS device thus described can be achieved by methods commonly used in the semiconductor industry. For example, starting with a semiconductor substrate which includes a high conductivity layer and a low conductivity epitaxial layer, the relatively low conductivity body 22, higher conductivity body 24 and source 10 regions can be conventionally pattern generated and diffused.

Figure 2:
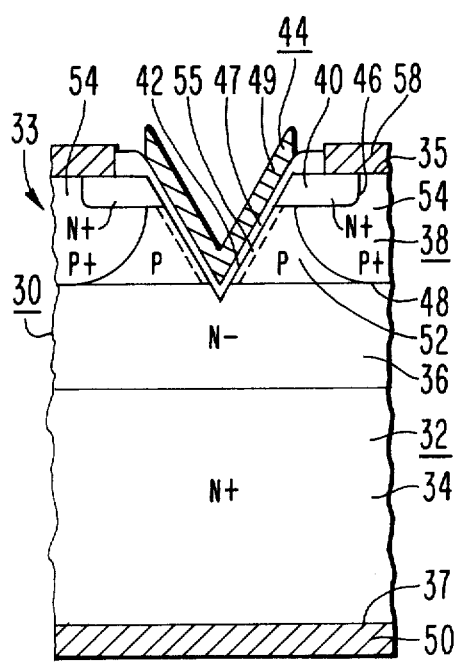
FIG. 2 is a sectional view of a VMOS device embodying the present invention.

Referring to FIG. 2, a VMOS device 33 of the present invention is shown. The device 33 also comprises a substantially planar substrate 30 having first and second opposing major surfaces (35 and 37, respectively). A substantially planar drain region 32 is adjacent to the second surface 37, and in the preferred embodiment comprises a relatively high conductivity portion 34 at the second surface, and a relatively low conductivity extended drain 36 disposed across the high conductivity portion. A body region 38 extends into the substrate from the first surface 35 so as to form a PN junction 48 with the drain region 32.

In the VMOS device 33 a groove 42 extends into the substrate from the first surface 35 so as to intercept the body region 38. A pair of source regions 40 extend into the substrate from the first surface 35, each being adjacent to the groove 42 at the first surface and forming a PN junction 46 with the body region 38. Each of these source regions 40 is spaced from the extended drain region 36 so as to define the length of a channel portion 55 at the groove surface of the body region 38. It should be noted that in the preferred embodiment the groove 42 is V-shaped and may be generated by anisotropically etching the substrate 30. However, the groove shape is not so limited in the present invention. For example, the groove might have a curved (e.g., U-shaped) profile, a generally rectangular profile (with walls perpendicular to the semiconductor surface 35), or a substantially V-shaped profile with a flat (i.e., parallel to semiconductor surface 35) bottom surface.

A gate 44 is disposed on the surface of the groove 42 and comprises an oxide 47 over the channel portions 55, and an electrode 49 over the oxide. Generally, the oxide 47 and electrode 49 layers of the gate 44 can be continuous across the groove surface. A pair of source electrodes 58 short the source/body junctions 46 at the first semiconductor surface 35, and a drain electrode 50 contacts the drain region 34 on the second semiconductor surface 37.

The principles of operation of the VMOS device 33 are substantially similar to those of the VDMOS device 3. The basic distinction is that in the VDMOS device the gate is located on a major semiconductor surface, such that channel portions are induced in those portions of the body regions at the major semiconductor surface. In the VMOS device the gate is located on a groove surface and induces channel portions in those portions of the body at the groove surface.

For the reasons discussed with reference to the VDMOS device 3, the VMOS embodiment of the present invention also comprises a body region 38 having a relatively low conductivity region 52 and a higher conductivity region 54, such that the channel portion 55 is formed within the relatively low conductivity region. In the VMOS device 33 the relatively low conductivity region 52 is adjacent to the groove 42 and a pair of higher conductivity regions 54 extends from the first surface 35 such that the groove extends between the higher conductivity regions. This device can also be made using conventional pattern generation and diffusion techniques, although a novel technique, described herein, will yield a device having the groove 42 automatically self-aligned to the relatively high and low conductivity portions of the body region 38. This self-alignment process can be performed using either a three mask layer process sequence or a four mask layer process sequence. Two embodiments of three mask layer process and three embodiments of four mask layer process are disclosed.

Figure 3:
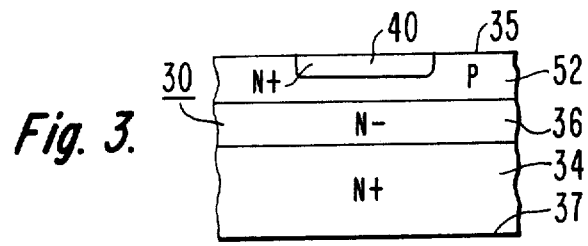
FIGS. 3-9 illustrate a three mask layer process sequence for generating a VMOS device of the present invention.

The first embodiment of the three mask layer process is described with reference to FIGS. 3–9. Referring first to FIG. 3, a semiconductor substrate 30, having first and second opposing major surfaces (35 and 37) is provided. The substrate includes a substantially planar first conductivity type drain region 34 at the second surface 37. A first conductivity type extended drain 36, of lower conductivity than the drain 34, is disposed across the drain region 34, and a second conductivity type body region 52 is adjacent to the extended drain. A source region 40 of first conductivity type is generated so as to extend into the substrate 30 from the first surface 35 within the boundaries of the body region 52. The extended drain 36 might be formed, for example, by epitaxial growth, and both the body 52 and source 40 might be formed, for example, by masking and diffusing appropriate dopants from the first semiconductor surface 35.

Figure 4:
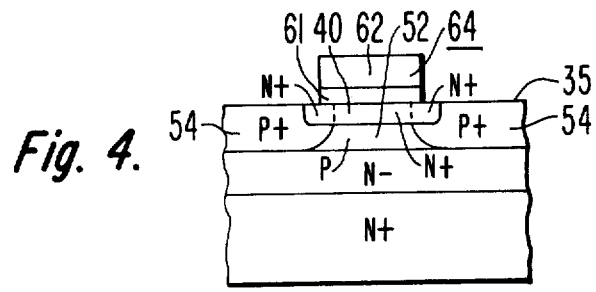

Referring to FIG. 4, a two layer structure 64 comprising primary 61 and secondary 62 mask layers of suitable etch resistant materials is then formed over the source region 40 on the first surface 35. The primary and secondary layers might respectively be, for example, $Si_3N_4$ and $SiO_2$ (alternative I) or $Si_3N_4$ and photoresist (alternative II). The two layer structure 64 can be formed by sequentially forming the primary and secondary layers, followed by selectively removing the two layers. The materials of alternative I can be selectively removed, for example, by generating a photoresist mask (not shown) on the surface of the $SiO_2$ layer, removing the $SiO_2$ in areas not covered with photoresist, removing the photoresist, and removing the $Si_3N_4$ layer in areas not covered by $SiO_2$. The $SiO_2$ mask layer might be removed by etching in hydrofluoric acid, and the $Si_3N_4$ layer might be removed by etching in hot ($\simeq 180°$ C.) phosphoric acid.

With alternative II there is no need for an additional photoresist pattern generation sequence to achieve the selective removal. Instead, the photoresist of the secondary mask layer 62 can itself be patterned by photolithographic techniques so as to define the two layer structure 64, and the underlying $Si_3N_4$ of the primary mask layer 61 can then be removed by plasma etching.

It may be noted that the selective removal medium for $Si_3N_4$ depends upon the mask layer which overlies it. When the overlying mask layer is $SiO_2$, hot phosphoric acid may be used to etch the $Si_3N_4$. However, when photoresist overlies the $Si_3N_4$, hot phosphoric acid cannot be used because it would attack the photoresist mask as well. Plasma etching has therefore been indicated as a possible method for selectively removing $Si_3N_4$ when photoresist is the overlying mask material (i.e., alternative II).

Following the formation of the two layer structure 64, a pair of body regions 54 of higher conductivity second conductivity type material than the relatively low conductivity body region 52 is formed. They can be formed, for example, by implanting an appropriate dopant in the areas not masked by the two layer structure 64, and then driving this dopant to a desired depth (optimally equal to the depth of the relatively low conductivity body portion 52). It should be noted that as these higher conductivity body regions 54 are driven to the desired depth they are also driven laterally (parallel to the semiconductor surface) under the two layer structure 64. For any specific dopant, this lateral diffusion distance is regulated by such parameters as diffusion time and temperature, and can be calculated using commonly known methods. Since the source 40 and relatively low conductivity body 52 are also driven at this time, a variation of the process would initially provide a substrate into which the source 40 and low conductivity body 52 have been shallowly doped or ion implanted. The source 40 and relatively low conductivity body 52 could then be simultaneously driven (to their final depth) with the higher conductivity body regions 54, at this point in the processing. For such a process, the second conductivity type dopant (for example, arsenic) should be a slower diffusing element than the first conductivity type dopant (for example, boron).

Although the body regions 54 are of high conductivity compared to the relatively low conductivity body region 52, they are of lower conductivity than the source region 40. Typical final peak dopant concentrations (after the diffusions are completed), might be: source region 40: $>10^{19}$ atoms/cc; relatively high conductivity body regions 54: $\simeq 10^{18}$–$10^{19}$ atoms/cc; and relatively low conductivity body region 52: $\simeq 10^{16}$–$10^{17}$ atoms/cc.

Figure 5:
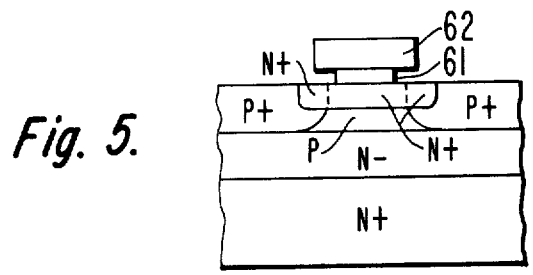

Referring now to FIG. 5, the secondary mask layer 62 is undercut (i.e., the primary mask layer 61 is partially removed from beneath the secondary mask layer) so as to yield the secondary mask layer overhanging the primary mask layer. The distance of the undercut is controlled so as to be greater than or equal to the extent of the lateral diffusion of the pair of higher conductivity body regions 54 and the same chemical or plasma etching mediums previously described can again be used. It should be noted that the thickness of the secondary mask layer 62 must be sufficient to provide a self-supporting structure during this undercutting operation. Additionally, the primary mask layer 61 must be thick enough to provide spacing between the edges of the undercut secondary layer 62 and the semiconductor surface 35. That is, if some sagging of the undercut secondary mask layer should occur during the undercutting operation, the thickness of the primary mask layer 61 should be such that the undercutting medium has access to that portion of the primary mask layer being etched. In the first embodiment, a $Si_3N_4$ primary mask layer might be approximately 1000 Angstroms thick, a $SiO_2$ secondary layer (alternative I) might be approximately 3000–6000 Angstroms, and a photoresist secondary layer (alternative II) might be approximately 1–5 microns.

Figures 6, 10:
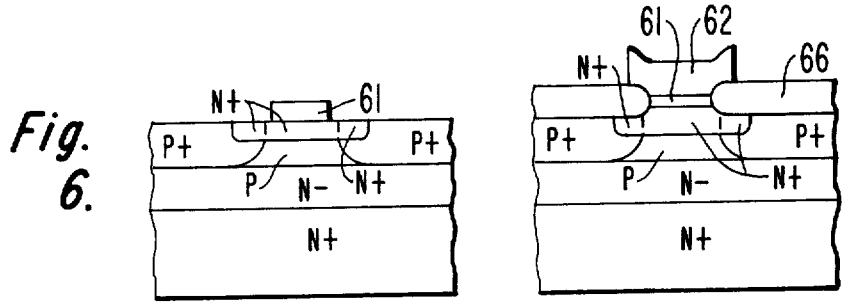
FIG. 10 illustrates a second embodiment of the three mask layer process sequence.
Figure 7:
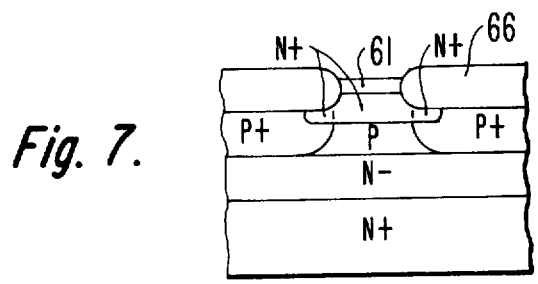
Figure 8:
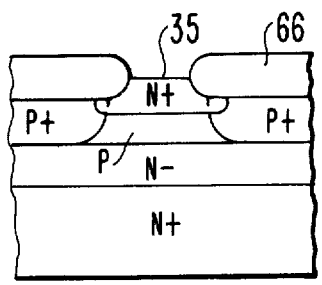

Following the undercutting operation, the secondary mask layer 62 is stripped, yielding the structure illustrated in FIG. 6. Referring to FIG. 7, a third mask layer 66 is then formed in those areas not covered by the primary mask layer 61 and ideally comprises thermally grown $SiO_2$. The primary mask layer 61 is then stripped, yielding the structure of FIG. 8.

Figure 9:
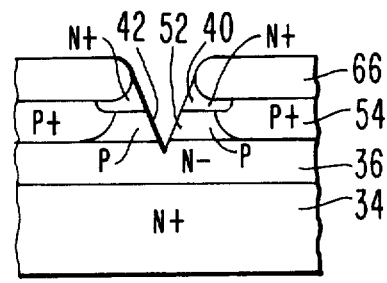

Referring to FIG. 9, a groove 42 is formed in the first surface 35 in the area not masked by the third mask layer 66. In the preferred embodiments, the groove is V-shaped, and may be formed, for example, using a technique described in "Fabrication of Novel Three Dimensional Microstructures by the Anisotropic Etching of (100) and (110) Silicon", E. Bassous, IEEE Transactions, ED-25, No. 10, October, 1978. The depth of the groove is determined by the size of the opening in the third mask layer 66, and should be such that the relatively low conductivity body region 52 is exposed within the groove.

The VMOS device 33 can be completed by generating a gate oxide on the exposed body region in the groove, a gate electrode on the gate oxide, a drain electrode contacting the drain region on the second surface, and a source electrode contacting the source region and high conductivity body regions on the first surface.

As previously indicated, the primary and secondary mask layers in the first embodiment of the three layer system can be any suitable etch resistant materials, such as those of alternatives I and II. Alternative I represents what might be considered a basic three mask layer system, using a $Si_3N_4$ primary layer and a $SiO_2$ secondary layer. Alternative II replaces the $SiO_2$ secondary layer of alternative I with photoresist, thereby facilitating the selective removal operation.

Referring to FIG. 10, a processing step of a second embodiment of the three layer sequence is illustrated. In the second embodiment, this processing step is substituted for the one represented in FIG. 6, and reflects forming the third mask layer 66 prior to stripping the secondary mask layer 62. This embodiment is appropriate, for example, when the primary layer 61 is $SiO_2$, the secondary layer 62 is $Si_3N_4$ and the third layer 66 is thermally grown $SiO_2$. Typical thicknesses for such primary and secondary layers might be approximately 500–1000 angstroms and 2000–6000 angstroms, respectively. The $SiO_2$ third mask layer 66 should be of sufficient thickness to withstand the stripping of the $SiO_2$ primary layer 61. An advantage of this embodiment is that it provides an $SiO_2$ primary layer. Since $SiO_2$ is a relatively easy and controllable material to etch, its use as a primary mask layer facilitates the undercutting operation.

With either of these embodiments the groove 42 is automatically centered between the higher conductivity body regions 54. The two layer structure 64 defines the location of the higher conductivity body regions 54 within the relatively low conductivity body region 52 and also determines the location of the third mask layer 66 which ultimately defines the groove. In addition to the self-alignment feature, the present invention permits close control over the distance between the higher conductivity body regions 54 and the groove 42. This distance is determined by controlling both the lateral diffusion of the higher conductivity body regions 54, and the undercutting of the two layer structure 64. An optimal design would define the relatively low conductivity body portion 52 as just large enough to accommodate the conduction channel induced during device operation.

Figure 11:
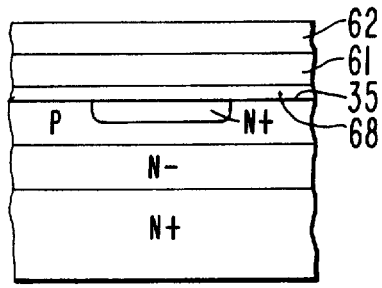
FIGS. 11-18 illustrate a first embodiment of a four mask layer process sequence for generating a VMOS device of the present invention.

Referring generally to the sequences starting with FIG. 11, the three embodiments of the four mask layer system are presented. The four mask layer system is substantially similar to the three layer system except that a fourth mask layer 68 is provided between the primary mask layer 61 and the substrate surface 35.

Referring to the first embodiment of the four mask layer system (FIGS. 11–18), a sequence is shown wherein that portion of the fourth mask layer 68 underlying the primary mask layer 61 is removed after the primary layer is stripped. The third and fourth mask layers (66 and 68, respectively) might be thermally grown $SiO_2$, and the primary 61 and secondary 62 layers might be the materials of alternatives I or II (as used in the three layer system). In this embodiment, the $SiO_2$ fourth layer 68 provides a barrier between the $Si_3N_4$ primary layer 61 and the semiconductor surface 35, thus alleviating potential concern over nitride damage to the semiconductor surface 35.

Figure 12:
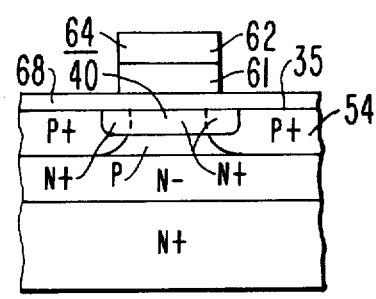

Referring to FIG. 12, the two layer structure 64 is shown on the surface of the fourth mask layer 68, and again overlies the previously formed source region 40. It should be noted that the high conductivity body region 54 diffusion can be formed through the fourth mask layer 68, for example, by ion implantation.

Figure 13:
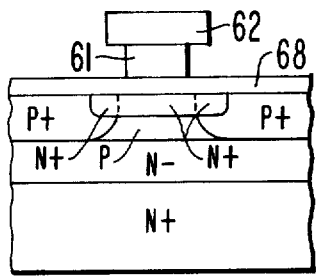
Figure 14:
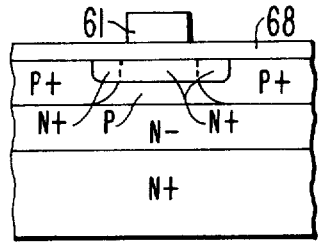
Figure 15:
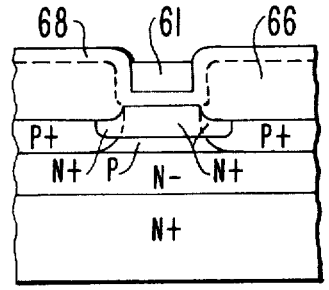
Figure 19:
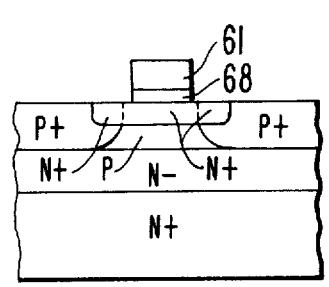
FIGS. 19-23 illustrate a second embodiment of the four mask layer process sequence.
Figure 16:
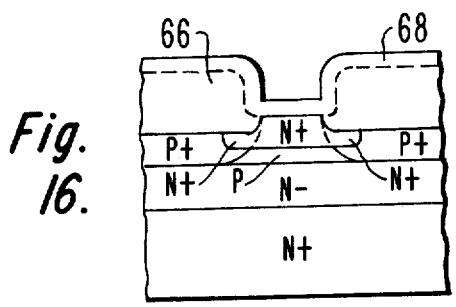
Figure 17:
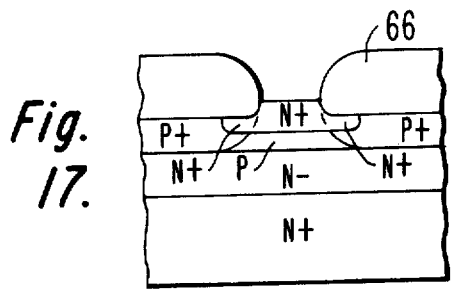
Figure 18:
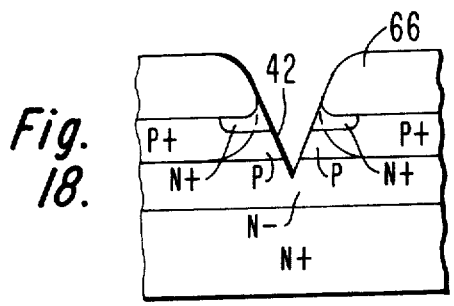

FIGS. 13 and 14 represent the device following the undercutting and secondary layer stripping operations. Referring to FIGS. 15 and 16, the structure is shown following the thermal growth of the $SiO_2$ third mask layer 66 and the subsequent stripping of primary layer 61. Since both the third layer 66 and the fourth layer 68 are grown oxides and the third layer is formed subsequent to the fourth, the structure is illustrated with the fourth layer overlying the third layer. There is no distinct boundary between the two layers. Referring to FIG. 17 the fourth mask layer which was underlying the primary mask layer is then removed (an operation which tends to also remove the portion of the fourth mask layer overlying the third mask layer). The groove 42 is then formed, as illustrated in FIG. 18, and is followed by the generation of the gate oxide and the gate, source, and drain electrodes.

Figure 20:
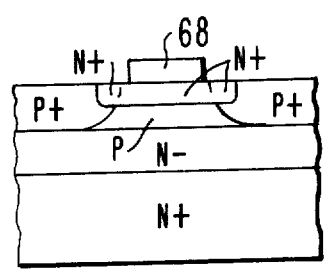
Figure 21:
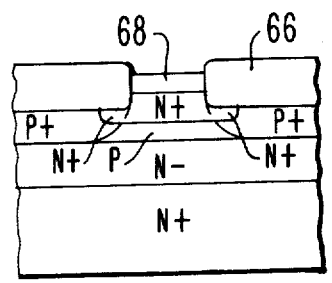
Figure 22:
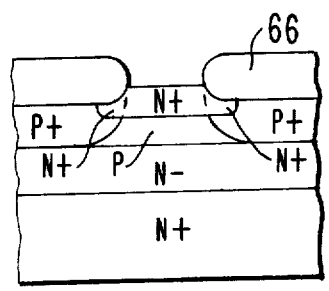
Figure 23:
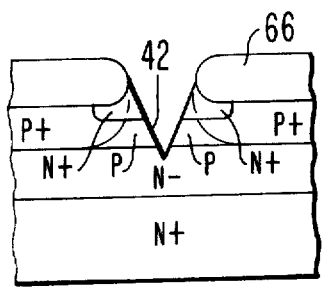

In the second embodiment of the four layer system the processing steps represented by FIGS. 19–23 are substituted for the steps of FIGS. 15–18, so as to yield a sequence represented by FIGS. 11–14, 19–23. In this embodiment, those portions of the fourth mask layer 68 which are not covered by the primary mask layer 61 are removed following the stripping of the secondary mask layer 62, yielding the structure of FIG. 19. Referring to FIGS. 20–22, the primary layer 61 is stripped, followed by the formation of the third layer 66 and the stripping of the fourth layer 68. Formation of the groove 42 can be performed by the method used in the first embodiment, and is represented in FIG. 23.

It might be noted that the steps of FIGS. 20–23 are substantially similar to those described with reference to FIGS. 6–9 in the three layer system, if the fourth mask layer 68 in FIGS. 20 and 21 is considered analogous to the primary mask layer 61 in FIGS. 6 and 7. Again, the gate oxide, and the source, gate and drain electrodes, are appropriately generated following the groove formation, so as to yield the completed VMOS device 33.

Figure 24:
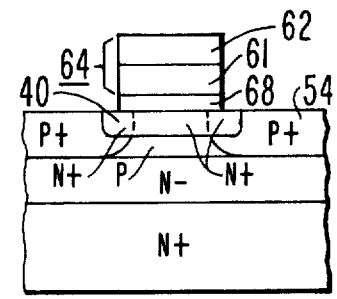
FIGS. 24-26 illustrate a third embodiment of the four mask layer process sequence.
Figure 25:
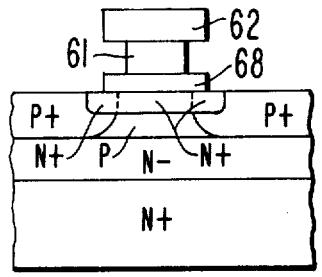
Figure 26:
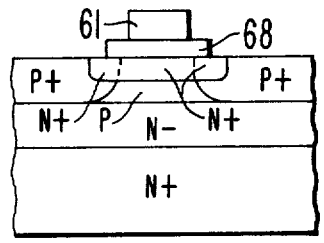

The third embodiment of the four mask layer system differs from the second embodiment in the initial processing steps. In the third embodiment, the steps of FIGS. 24–26 are substituted for those of FIGS. 12–14, so as to yield a sequence represented by FIGS. 11, 24–26, 19–23. Referring to FIG. 24, the essential distinction between the second and third embodiments is the formation of the fourth mask layer 68 coincident with the two layer structure 64 in the third embodiment. For example, the fourth mask layer 68 might be selectively removed following selective removal of the primary and secondary layers. The relatively high conductivity body regions 54 are then formed in areas not covered by the two layer structure 64. FIGS. 25 and 26 represent, respectively, the undercutting and stripping of the secondary layer 62.

In the second and third embodiments of the four mask layer system the fourth mask layer 68 material might be $Si_3N_4$; the primary mask layer 61 might be $SiO_2$; and the secondary mask layer 62 might be $Si_3N_4$ or photoresist. Either embodiment (using a $Si_3N_4$ fourth mask layer) is appropriate when the desirability of having a readily etchable primary layer 61 (during the undercutting operation) outweighs the concern over possible nitride damage to the semiconductor surface 35.

The present invention thus describes two types (VDMOS and VMOS) of readily manufacturable vertical MOSFET devices having reduced bipolar parasitics, as well as a unique method for manufacturing a VMOS device.

What is claimed is:

1. A method for fabricating a VMOS device having minimized parasitic bipolar effects, comprising:
providing a semiconductor substrate having first and second opposing major surfaces including therein: a substantially planar first conductivity type drain region at the second surface; a substantially planar first conductivity type extended drain region of lower conductivity than the drain region disposed across the drain region; and a second conductivity type body region adjacent to the extended drain region;

forming a first conductivity type source region extending from the first surface within the boundaries of the body region;

forming a two layer structure over the source region, said structure comprising a secondary mask layer over a primary mask layer;

forming a pair of relatively high conductivity body regions, of lower conductivity than the source region, in those areas not covered with the two layer structure, said relatively high conductivity body regions extending from the first surface to approximately the same depth as the lower conductivity body region and diffusing laterally beneath the two layer structure a predetermined distance;

undercutting the secondary mask layer a distance greater than said lateral diffusion distance so as to yield the secondary mask layer overhanging the primary mask layer;

stripping the secondary mask layer;

forming a third mask layer in areas not covered by the primary mask layer;

stripping the primary mask layer;

forming a groove in the area not masked by the third mask layer, so as to expose the relatively low conductivity body; and forming a gate oxide on the exposed body region in the groove, a gate electrode on the gate oxide, a drain electrode on the drain region at the second surface, and a source electrode on the source region and relatively high conductivity body regions at the first surface.

2. The method of claim 1 wherein the method for forming the two layer structure comprises:

sequentially forming the primary and secondary mask layers; and selectively removing both layers.

3. The method of claim 1 wherein:

the primary mask layer is $SiO_2$;

the secondary mask layer is $Si_3N_4$;

the third mask layer is thermally grown $SiO_2$ of sufficient thickness to withstand the stripping of the primary mask layer; and the secondary mask layer is stripped after the third mask layer is formed.

4. The method of claim 1, further comprising:

thermally growing a $SiO_2$ fourth mask layer on the first surface prior to forming the two layer structure;

forming the third mask layer by thermally growing $SiO_2$; and removing that portion of the fourth layer which underlies the primary layer after the primary layer is stripped.

5. The method of claims 1 or 4 wherein:

the primary mask layer is $Si_3N_4$; and the secondary mask layer is $SiO_2$.

6. The method of claims 1 or 4 wherein:

the primary mask layer is $Si_3N_4$;

the secondary mask layer is photoresist; and the undercutting of the photoresist is performed by plasma etching.

7. The method of claim 1 further comprising:

forming a fourth mask layer on the first surface prior to forming the two layer structure;

removing those portions of the fourth mask layer which are not covered by the primary mask layer, following the stripping of the secondary mask layer;

stripping the primary mask layer prior to forming the third mask layer; and stripping the fourth mask layer after forming the third mask layer.

8. The method of claim 7 further comprising:

forming the fourth mask layer coincident with the two layer structure.

9. The method of claims 7 or 8 wherein:

the fourth mask layer is $Si_3N_4$;

the primary mask layer is $SiO_2$; and the secondary mask layer is $Si_3N_4$.

10. The method of claims 7 or 8 wherein:

the fourth mask layer is $Si_3N_4$;

the primary mask layer is $SiO_2$; and the secondary mask layer is photoresist.

11. The method of claims 4, 7 or 8 wherein:

the distance of undercutting is substantially equal to the lateral diffusion distance of the relatively high conductivity body regions.

* * * * *